United States Patent
Lu et al.

(10) Patent No.: US 12,328,985 B2
(45) Date of Patent: Jun. 10, 2025

(54) LIGHT EMITTING DEVICE AND METHOD FOR DRIVING THE SAME, AND DISPLAY PANEL

(71) Applicant: HKC CORPORATION LIMITED, Shenzhen (CN)

(72) Inventors: Zhaoyang Lu, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 193 days.

(21) Appl. No.: 18/347,968

(22) Filed: Jul. 6, 2023

(65) Prior Publication Data
US 2024/0260303 A1  Aug. 1, 2024

(30) Foreign Application Priority Data

Jan. 31, 2023 (CN) .......................... 202310093483.3

(51) Int. Cl.
*G09G 3/32* (2016.01)
*H05B 45/60* (2022.01)
(Continued)

(52) U.S. Cl.
CPC .............. *H10K 50/19* (2023.02); *H05B 45/60* (2020.01); *H10K 59/123* (2023.02)

(58) Field of Classification Search
CPC ........ H05B 45/10; H05B 45/20; H05B 45/60; G09G 3/30; G09G 3/32; G09G 3/3208;
(Continued)

(56) References Cited

U.S. PATENT DOCUMENTS 6,278,417 B1   8/2001  Bock et al.
2003/0218173 A1  11/2003  Nishi et al.
(Continued)

FOREIGN PATENT DOCUMENTS

CN   1836332 A   9/2006
CN   107134256 A   9/2017
(Continued)

OTHER PUBLICATIONS

Office Action issued on Aug. 7, 2024, in corresponding Chinese Application No. 202310093483.3, 18 pages.
(Continued)

*Primary Examiner* — Long Nguyen
(74) *Attorney, Agent, or Firm* — Maier & Maier, PLLC

(57) ABSTRACT

A light emitting device includes: a first light emitting unit and a second light emitting unit arranged beneath the first light emitting unit. The first light emitting unit and the second light emitting unit are alternately conducted. The first light emitting unit includes: a first cathode, a first electron transport layer, a first luminescent layer, a first hole transport layer, and a first anode arranged sequentially from bottom to top. The second light emitting unit includes: a second anode, a second hole transport layer, a second luminescent layer, a second electron transport layer, and a second cathode arranged sequentially from bottom to top. The first cathode, the first anode, the second cathode, and the second anode are all connected to AC power supplies, respectively.

20 Claims, 5 Drawing Sheets

(51) Int. Cl.
*H10K 50/19* (2023.01)
*H10K 59/123* (2023.01)

(58) Field of Classification Search
CPC ...... G09G 3/3225; H10K 50/10; H10K 50/19;
H10K 59/10; H10K 59/12; H10K 59/123;
H10K 59/30; H10K 59/32
See application file for complete search history.

(56) References Cited

U.S. PATENT DOCUMENTS

| | | |
|---|---|---|
| 2005/0189875 A1 | 9/2005 | Nakada |
| 2011/0215396 A1 | 9/2011 | Tang et al. |
| 2018/0088123 A1* | 3/2018 | Xie ..................... C07D 417/10 |
| 2019/0157597 A1* | 5/2019 | Liao ..................... H10K 50/156 |

FOREIGN PATENT DOCUMENTS

| | | |
|---|---|---|
| CN | 107808895 A | 3/2018 |
| CN | 107958962 A | 4/2018 |
| CN | 111816782 A | 10/2020 |
| JP | 2006164650 A | 6/2006 |

OTHER PUBLICATIONS

Search Report issued on Oct. 15, 2024, in corresponding Chinese Application No. 202310093483.3, 8 pages.

\* cited by examiner in a first half cycle of each alternate conduction cycle, outputting higher potential voltages to the first cathode and the second cathode, respectively, and outputting lower potential voltages to the first cathode and the second anode, respectively; ~S110 in a second half cycle of each alternate conduction cycle, outputting lower potential voltages to the first cathode and the second cathode, respectively, and outputting higher potential voltages to the first cathode and the second anode, respectively. ~S120

FIG. 3

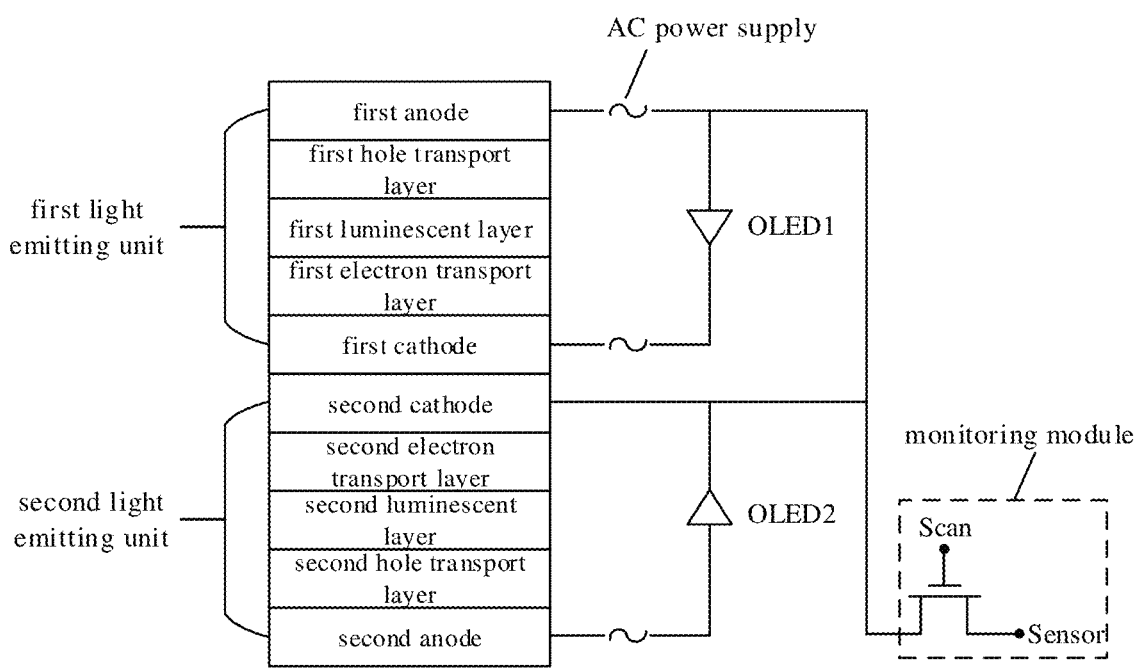

FIG. 4

LIGHT EMITTING DEVICE AND METHOD FOR DRIVING THE SAME, AND DISPLAY PANEL

CROSS-REFERENCE TO RELATED APPLICATIONS

Pursuant to 35 U.S.C. § 119 and the Paris Convention, this application claims the benefit of Chinese patent application Ser. No. 20/231,0093483.3 filed Jan. 31, 2023, the contents of which are incorporated herein by reference.

TECHNICAL FIELD

The present application relates to the technical field of display, and more particularly to a light emitting device and a method for driving the same, and a display panel and a method for fabricating the same.

BACKGROUND

Light emitting devices, such as organic light emitting diodes (OLED), are more and more widely used in products including computers and mobile phones, due to the characteristics of thinness and light weight, energy saving, wide color gamut, and high contrast.

Materials of light emitting devices such as OLEDs will gradually age during the application process, which will affect the image quality of the display panel. At present, in order to solve the aging problem of light emitting devices such as OLEDs, two OLEDs sharing common electrodes are usually arranged in a vertical direction, AC power supplies are input to the common electrodes, and DC power supplies are input to independent cathodes or independent anodes. By periodical voltage change of the AC power supplies, the two stacked light emitting units can emit light in different periods within one cycle, that is, alternate light emitting of the two OLEDs are realized, so as to delay the aging of the OLED.

However, the above solution will cause the threshold voltage of the driving thin film transistor of the OLED to shift, resulting in a difference in the brightness of the OLED and affecting the display effect.

SUMMARY

In view of the above-described problems, it is an objective of the present application to provide a light emitting device and a method for driving the same, and a display panel and a method for fabricating the same, so as to reduce the impact on the threshold voltage of the driving thin film transistor of the OLED while delaying the aging of the OLED, so as to improve the display effect.

In order to achieve the above objective, in a first aspect, embodiments of the present application provide a light emitting device. The light emitting device comprises: a first light emitting unit, and a second light emitting unit arranged beneath the first light emitting unit. The first light emitting unit and the second light emitting unit are alternately conducted.

The first light emitting unit comprises: a first cathode, a first electron transport layer, a first luminescent layer, a first hole transport layer, and a first anode arranged sequentially from bottom to top.

The second light emitting unit comprises: a second anode, a second hole transport layer, a second luminescent layer, a second electron transport layer, and a second cathode arranged sequentially from bottom to top.

The first cathode, the first anode, the second cathode, and the second anode are all connected to AC power supplies, respectively.

As an optional implementation manner of an embodiment of the present application, the first anode and the second cathode are connected to a same AC power supply.

As an optional implementation manner of an embodiment of the present application, the first anode, the first cathode, the second anode, and the second cathode are connected to different AC power supplies, respectively.

As an optional implementation manner of an embodiment of the present application, the light emitting device further includes a transition layer disposed between the first cathode and the second cathode.

As an optional implementation manner of an embodiment of the present application, the first cathode, the second cathode, and the transition layer are all made of transparent conductive materials.

As an optional implementation manner of an embodiment of the present application, in each alternate conduction cycle, a number of conduction frames of the first light emitting unit and a number of conduction frames of the second light emitting unit are both N frames, where N is a positive integer.

In a second aspect, embodiments of the present application provide a method for driving a light emitting device, which is applied to the light emitting device as described in the first aspect or any embodiment of the first aspect, the method comprises:

in a first half cycle of each alternate conduction cycle, outputting higher potential voltages to the first cathode and the second cathode, respectively, and outputting lower potential voltages to the first cathode and the second anode, respectively; and in a second half cycle of each alternate conduction cycle, outputting lower potential voltages to the first cathode and the second cathode, respectively, and outputting higher potential voltages to the first cathode and the second anode, respectively.

In a third aspect, embodiments of the present application provide a display panel. The display panel comprises a plurality of pixels, each pixel comprising the light emitting device as described in the first aspect or any embodiment of the first aspect.

As an optional implementation manner of an embodiment of the present application, the display panel further comprises: a substrate, a shading layer, a buffer layer, an active layer, a gate insulating layer, a gate, a source, a drain, a plurality of via holes, an interlayer dielectric layer, a passivation layer, a flat layer, and a pixel defining layer.

The shading layer is disposed above the substrate; the buffer layer is disposed above the shading layer and the substrate; the active layer is disposed above the buffer layer; the gate insulating layer is disposed above the active layer; the gate is disposed above the gate insulating layer.

The interlayer dielectric layer is disposed above the buffer layer, the active layer, the gate insulating layer, and the gate.

The source and the drain are disposed above the interlayer dielectric layer, and are in contact with two ends of the active layer through different via holes.

the passivation layer is disposed above the interlayer dielectric layer, the source, and the drain; the flat layer is disposed above the passivation layer.

The second anode is disposed above the flat layer and the passivation layer, and is in contact with the source or the drain through via holes.

The pixel defining layer is disposed above the second anode; the second hole transport layer is disposed above the second anode and the pixel defining layer.

In a fourth aspect, embodiments of the present application provide a method for fabricating a display panel. The method is used to fabricating the display panel as described in the third aspect or any embodiment of the third aspect. The method comprises:

forming a shading layer on a substrate;
forming a buffer layer over the shading layer and the substrate;
sequentially forming an active layer, a gate insulating layer, and a gate above the buffer layer;
forming an interlayer dielectric layer above the buffer layer, the active layer, the gate insulating layer, and the gate;
forming a source and a drain above the interlayer dielectric layer;
forming a passivation layer above the interlayer dielectric layer, the source, and the drain;
form a flat layer above the passivation layer;
forming the second anode above passivation layer and the flat layer;
form a pixel defining layer above the second anode;
forming a second hole transport layer above the second anode and the pixel defining layer; and
sequentially forming a second luminescent layer, a second electron transport layer, a second cathode, a transition layer, a first cathode, a first electron transport layer, a first luminescent layer, a first hole transport layer, and a first anode above the second hole transport layer.

In the technical solution provided by embodiments of the present application, the light emitting device comprises: the first light emitting unit, and the second light emitting unit arranged beneath the first light emitting unit. The first light emitting unit and the second light emitting unit are alternately conducted. The first light emitting unit comprises: the first cathode, the first electron transport layer, the first luminescent layer, the first hole transport layer, and the first anode arranged sequentially from bottom to top. The second light emitting unit comprises: the second anode, the second hole transport layer, the second luminescent layer, the second electron transport layer, and the second cathode arranged sequentially from bottom to top. The first cathode, the first anode, the second cathode, and the second anode are all connected to AC power supplies, respectively. In the above technical solution, the first light emitting unit and the second light emitting unit are conducted alternately, so that the service life of the first light emitting unit and the service life of the second light emitting unit can be doubled, that is, this technical solution can make the service life of the light emitting device doubled. In addition, the first cathode, the first anode, the second cathode, and the second anode are all connected to the AC power supply, so that the influence of the DC voltage on the threshold voltage of the driving thin film transistor of the light emitting device can be reduced, and the display difference in alternate light emitting of the OLEDs is reduced, thereby improving the display effect.

BRIEF DESCRIPTION OF THE DRAWINGS

FIG. 3 is a schematic flowchart of a method for driving a light emitting device provided by an embodiment of the present application;

FIG. 4 is a schematic diagram of any pixel in a display panel provided by an embodiment of the present application;

DETAILED DESCRIPTION OF THE EMBODIMENTS

Embodiments of the present application are described below with reference to the drawings in the embodiments of the present application. Terms used in the implementation of the embodiments of the present application are only used to explain the specific embodiments of the present application, and are not intended to limit the present application. The following specific embodiments may be combined with each other, and the same or similar concepts or processes may not be repeated in some embodiments.

A light emitting device in embodiments of the present application may be any one of an organic light emitting diode (OLED), a quantum dot light emitting diode (QLED), and a mini light emitting diode (Mini LED). In this embodiment, it is taken the light emitting device being the OLED as an example for exemplary description.

Figure 1:
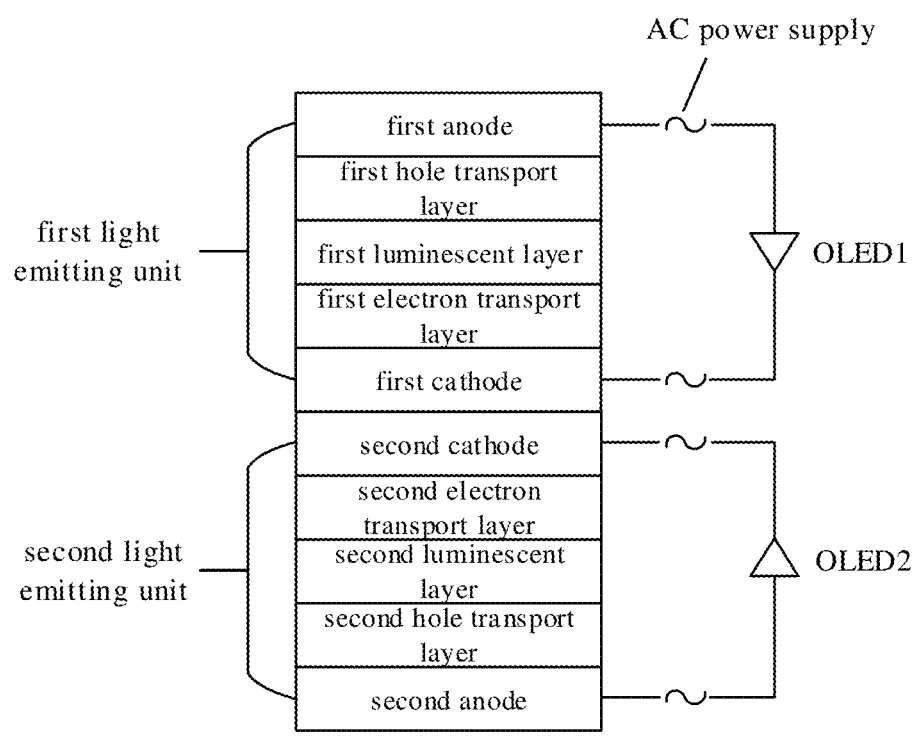
FIG. 1 is a schematic structural diagram of a light emitting device provided by an embodiment of the present application.

FIG. 1 is a schematic structural diagram of a light emitting device provided by an embodiment of the present application. As shown in FIG. 1, the light emitting device provided in an embodiment of the present application may include: a first light emitting unit and a second light emitting unit located below the first light emitting unit.

The first light emitting unit may include: a first cathode, a first electron transport layer, a first luminescent layer, a first hole transport layer, and a first anode arranged sequentially from bottom to top.

The second light emitting unit includes: a second anode, a second hole transport layer, a second luminescent layer, a second electron transport layer, and a second cathode arranged sequentially from bottom to top.

The first light emitting unit and the second light emitting unit are conducted alternately, so that the service life of the first light emitting unit and the service life of the second light emitting unit can be doubled.

In each alternate conduction cycle, the number of conduction frames of the first light emitting unit and the number of conduction frames of the second light emitting unit are both N frames, where N is a positive integer. Hereinbelow, in this embodiment, it is taken that the alternate conduction cycle includes 2 frames, and both the number of conduction frames of the first light emitting unit and the number of conduction frames of the second light emitting unit are one frame as an example for an exemplary description.

The first cathode, the first anode, the second cathode, and the second anode are all connected to an AC power supply, so that the influence of the DC voltage on a threshold voltage of the driving thin film transistor of the light emitting device can be reduced.

Both the first cathode and the second cathode are made of a transparent conductive material, to enable the light emitted by the first luminescent layer and the second luminescent layer to pass through.

Both the first anode and the second anode are made of a conductive material, and the light emitted by the first luminescent layer and the second luminescent layer can be emitted through the first anode or through the second anode. When the light emitted by the first luminescent layer and the second luminescent layer is emitted through the first anode, the first anode is made of a transparent conductive material; and when the light emitted by the first luminescent layer and the second luminescent layer is emitted through the second anode, the second anode is made of a transparent conductive material. Embodiments of the present application will be exemplified hereinbelow by taking the light emitted by the first luminescent layer and the second luminescent layer to be emitted through the first anode as an example (that is, the first anode is a transparent conductive material).

The first electron transport layer and the second electron transport layer can be composed of organic material molecules to transport "electrons" from the cathode.

The first luminescent layer and the second luminescent layer can be composed of an organic material for luminescence.

The first hole transport layer and the second hole transport layer can be composed of organic material molecules to transport "holes" from the anode.

To facilitate the transition of electrons in the first electron transport layer and the second electron transport layer, the light emitting device may further include a transition layer between the first cathode and the second cathode. The material of the transition layer is a transparent conductive material.

The first anode, first cathode, second anode, and second cathode can be respectively connected to different AC power supplies, so that the voltages of the first anode, the first cathode, the second anode, and the second cathode can be separately controlled, which improves the flexibility of adjusting the voltages of the first anode, the first cathode, the second anode, and the second cathode. In such condition, the connection of the AC power supplies can be as follows: the first anode is connected to a fourth AC power supply, the first cathode is connected to a fifth AC power supply, the second anode is connected to a sixth AC power supply, and the second cathode is connected to a seventh AC power supply. When controlling the two light emitting units, a voltage difference between the first anode and the first cathode is controlled to be U1, a voltage difference between the second anode and the second cathode is controlled to be U2, and U1 and U2 are kept the same, so as to minimize a difference in light emission during the alternate light emitting of the two light emitting units, thereby improving the display effect.

Figure 2:
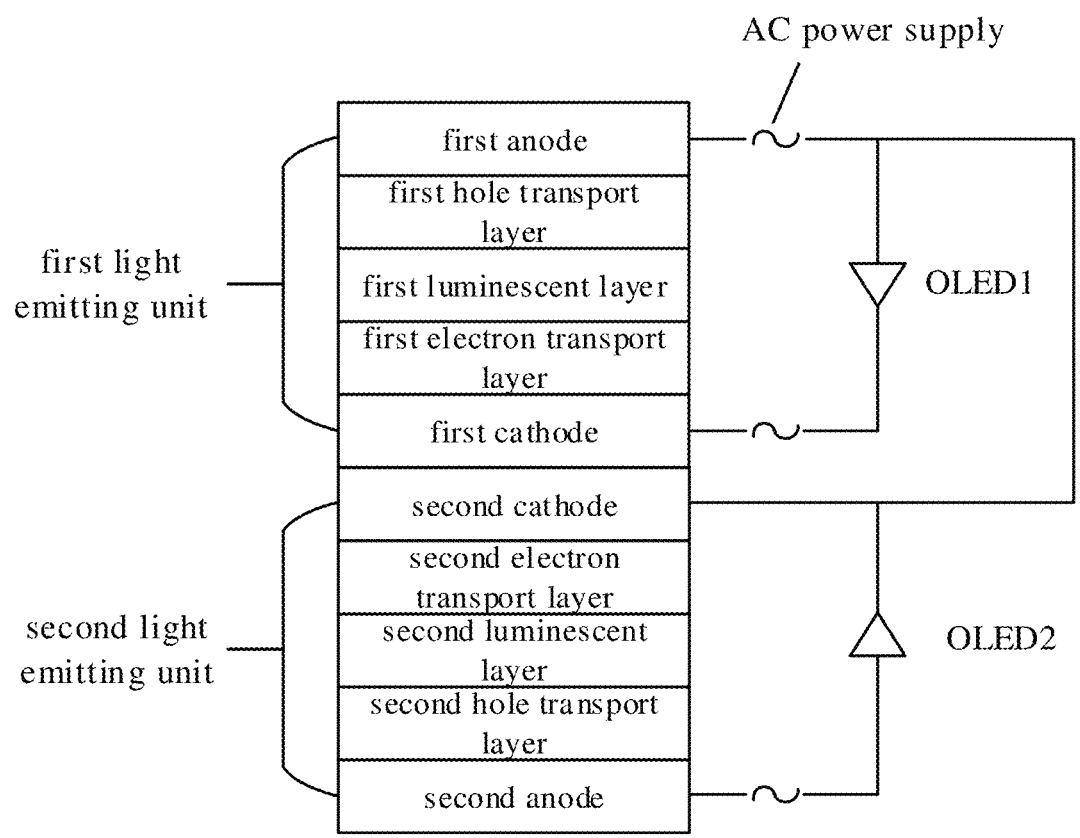
FIG. 2 is a schematic structural diagram of another light emitting device provided by an embodiment of the present application.

In order to reduce the number of connected AC power supplies and reduce the complexity of the light emitting device, the first anode and the second cathode can also be connected to the same AC power supply, as shown in FIG. 2. In such condition, the connection of the AC power supplies can be as follows: the first anode and the second cathode are connected to a first AC power supply, the first cathode is connected to a second AC power supply, and the second anode is connected to a third AC power supply. A voltage difference between the first AC power supply and the second AC power supply and a voltage difference between the first AC power supply and the third AC power supply are kept the same, so as to minimize the difference in light emission during the alternate light emitting of the two light emitting units, thereby improving the display effect.

FIG. 3 is a schematic flow chart of the driving method of the light emitting device provided in the embodiment of the present application. As shown in FIG. 3, the driving method of the light emitting device provided in the embodiment of the present application may include steps S110-S120:

In step S110, in a first half cycle of each alternate conduction cycle, higher potential voltages are output to the first cathode and the second cathode, respectively, and lower potential voltages are output to the first cathode and the second anode, respectively.

In the first half cycle of each alternate conduction cycle, since the first anode is at a higher potential voltage and the first cathode is at a lower potential voltage, the first light emitting unit (that is, the OLED1) is forward conducted and emits light; in addition, the second anode is at a lower potential voltage, the second cathode is at a higher potential voltage, the second light emitting unit (that is, the OLED2) is not conducted, and the OLED2 does not emit light.

In step S120, in a second half cycle of each alternate conduction cycle, lower potential voltages are output to the first cathode and the second cathode, respectively, and higher potential voltages are output to the first cathode and the second anode, respectively.

In the second half cycle of each alternate conduction cycle, since the first anode is at a lower potential voltage and the first cathode is at a higher potential voltage, the OLED1 is not conducted, and the OLED1 does not emit light; in addition, the second anode is at a higher potential voltage, and the second cathode is at a lower potential voltage, the OLED2 is forward conducted and emits light. In this way, the OLED1 and the OLED2 can emit light alternately.

Specifically, taking the light emitting device shown in FIG. 1 as an example, in the first half cycle of each alternate conduction cycle, the first anode can be connected to an AC voltage of 10 V, the first cathode can be connected to an AC voltage of 6 V, such that the OLED1 is forward conducted and emits light. Since the first anode adopts a transparent conductive material, the light emitted by the OLED1 passes through the first anode and is finally emitted out from the first anode. Meanwhile, the second cathode can be connected to an AC voltage of 9 V, and the second anode can be connected to an AC voltage of 5 V, such that the OLED2 is not conducted and does not emit light.

In the second half cycle of each alternate conduction cycle, the first anode can be connected to an AC voltage of 6 V, and the first cathode can be connected to an AC voltage of 10 V, such that the OLED1 is not conducted and does not emit light. Meanwhile, the second cathode can be connected to an AC voltage of 5 V, and the second anode can be connected to an AC voltage of 9 V, such that the OLED2 is forward conducted and emits light. Since the first anode, the first cathode, and the second cathode all adopt transparent conductive materials, the light emitted by the OLED2 sequentially passes through the second cathode, the first cathode, and the first anode and is finally transmitted out from the first anode.

It can be understood that since the first light emitting unit and the second light emitting unit are controlled by different AC power supplies, the two light emitting units (that is, the OLED1 and the OLED2) can also be controlled to emit light at the same time, so as to increase the brightness of the display panel. In addition, when one OLED is damaged, the luminous brightness of the other OLED can be enhanced to improve the uniformity of luminescence of the display panel.

Specifically, the control unit (such as the driver chip) can control the pixels to enter the normal display mode when the display panel has no dark spots (generally speaking, the display panel has no dead spots), and the stacked first light emitting unit and the second light emitting unit are adopted to emit light alternately to increase the service life of the pixels, thereby increasing the service life of the display panel. In case that the display panel has dark spots, a small number of pixels will have a difference in brightness during alternate light emitting. In such condition, the control unit can control the pixels to enter an abnormal display mode. For normal (non-dark spot) pixels, the control unit can control the normal pixels to emit light alternately; and for abnormal pixels (dark spots appear during alternate light emitting), the control unit can control the two light emitting units of the abnormal pixels to emit light at the same time, so as to improve the brightness of abnormal pixels, such that the brightness level of abnormal pixels is equal to the brightness level of normal pixels, thereby ensuring the uniformity of the light emission of the display panel in the abnormal display mode.

Specifically, taking the light emitting device shown in FIG. 2 as an example, in the first half cycle of each alternate conduction cycle, the first anode can be connected to an AC voltage of 10 V, the first cathode can be connected to an AC voltage of 6 V, such that the OLED1 is forward conducted and emits light. Since the first anode adopts a transparent conductive material, the light emitted by OLED1 passes through the first anode and is finally emitted out from the first anode. Since the first anode and the second cathode are connected to the same AC power supply, the AC voltage of the second cathode is also 10 V, and the second anode can be connected to an AC voltage of 5 V, such that the OLED2 is not conducted and does not emit light.

In the second half cycle of each alternate conduction cycle, the first anode can be connected to an AC voltage of 6 V, and the first cathode can be connected to an AC voltage of 10 V, such that the OLED1 is not conducted and does not emit light. Meanwhile, the AC voltage connected to the second cathode is the same as that of the first anode, which is also 6 V, and the second anode can be connected to an AC voltage of 9 V, such that the OLED2 is forward conducted and emits light. Since the first anode, the first cathode, and the second cathode all adopt transparent conductive materials, the light emitted by the OLED2 sequentially passes through the second cathode, the first cathode, and the first anode and is finally transmitted out from the first anode.

FIG. 4 is a schematic diagram of any pixel in a display panel provided by the embodiment of the present application. As shown in FIG. 4, the pixel may also include a monitoring module, and the monitoring module may include a monitoring transistor T1 and a current detection unit Sensor. A control electrode of the monitoring transistor T1 is connected to a control signal line Scan, a first electrode (a drain) of the monitoring transistor T1 is connected to the first anode of the first light emitting unit and the second cathode of the second light emitting unit, and a second electrode (source) of the monitoring transistor T1 is connected to the current detection unit Sensor.

The current detection unit Sensor may be a current sensor, a voltage sensor, or the like. When the first light emitting unit and the second light emitting unit emit light, the current detection unit Sensor can respectively detect the current of the first light emitting unit and the current of the second light emitting unit, and transmit the detected currents to a driver chip, and the driver chip can judge whether a difference exists between the current of the first light emitting unit and the current of the second light emitting unit. If a difference exists, the driver chip can regulate the respective data line voltages of the two light emitting units during the light emitting phase, so as to achieve the same light emitting current of the two light emitting units, which can further reduce the difference in brightness during the alternate light emitting, and ensure that the effects of the first light emitting unit and the second light emitting unit are as similar as possible during the alternate light emitting, thereby further improving the display effect.

Figure 5:
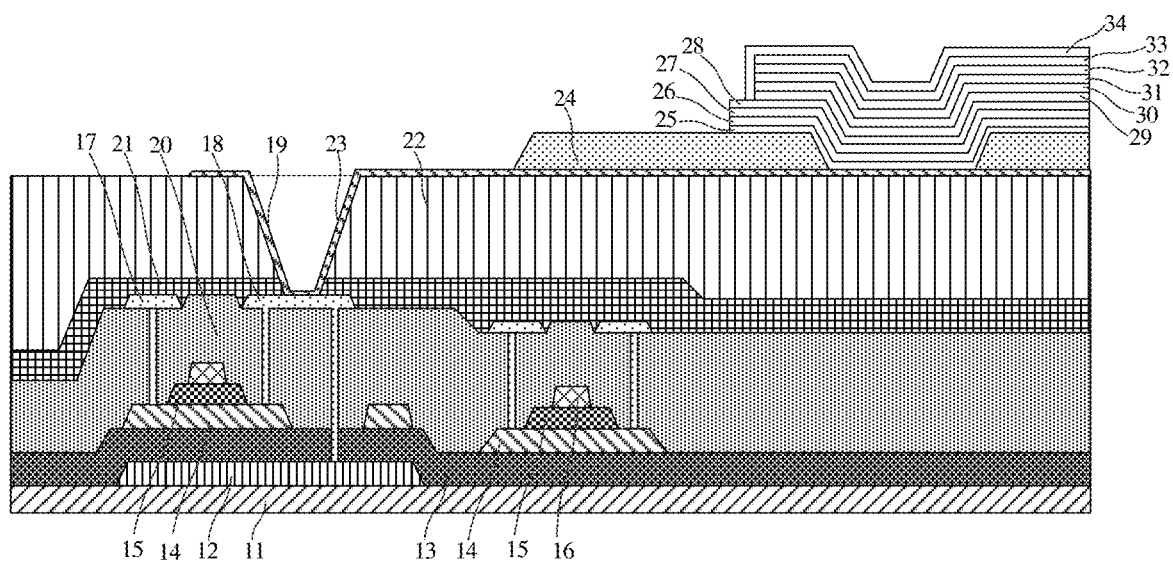
FIG. 5 is a schematic structural diagram of a display panel provided by an embodiment of the present application.

The display panel provided by embodiments of the present application may include a plurality of pixels, and each of the plurality of pixel includes a light emitting device as shown in FIG. 1 or FIG. 2. FIG. 5 is a schematic structural diagram of a display panel provided by an embodiment of the present application. As shown in FIG. 5, the display panel provided by an embodiment of the present application may include: a substrate 11, a shading layer 12, a buffer layer 13, an active layer 14, a gate insulating layer 15, a gate 16, a source 17, a drain 18, a plurality of via holes 19, an interlayer dielectric layer 20, a passivation layer 21, a flat layer 22, a pixel defining layer 24, and light emitting devices.

The substrate 11 may be a rigid substrate or a flexible substrate, the material of the rigid substrate may be glass, and the material of the flexible substrate may be a polymer material, such as a polyimide.

The shading layer 12 is disposed above the substrate 11. The shading layer 12 may 12 may include a plurality of light shielding units arranged at intervals. The shading layer 12 may be made of a metal, such as molybdenum, titanium, copper, and an oxide thereof, or made of a black resin and the like.

The buffer layer 13 is disposed above the shading layer 12 and the substrate 11. The buffer layer 13 acts as a buffer when the display is squeezed or dropped, reducing the probability of the display being broken. The buffer layer 13 can be made of a silicon dioxide and the like, which is beneficial to improve the electron mobility of indium gallium zinc oxide (IGZO).

The active layer 14 is disposed above the buffer layer 13, and the active layer 14 may be made of IGZO, so as to provide higher precision and lower power consumption for the display screen.

The gate insulating layer 15 is disposed above the active layer 14, and the gate insulating layer 15 can be made of one of silicon oxide and silicon nitride, or any combination thereof.

The gate 16 is disposed above the gate insulating layer 15, the interlayer dielectric layer 20 is disposed above the buffer layer 13, the active layer 14, the gate insulating layer 15, and the gate 16. The plurality of via holes 19 can be formed in the interlayer dielectric layer 20. The source 17 and the drain 18 can be disposed above the interlayer dielectric layer 20, and connected with two ends of the active layer 14 through different via holes 19.

The passivation layer 21 is disposed above the interlayer dielectric layer 20, the source 17, and the drain 18, and the passivation layer 21 can be made of silicon oxide, silicon nitride and a combination thereof, and is used for electrical isolation between layers.

The flat layer 22 is disposed above the passivation layer 21, and is used to improve the flatness and sealing of the internal structure of the display screen.

The second anode 23 is disposed above the flat layer 22 and the passivation layer 21, and is in contact with the source 17 or the drain 18 through the via holes 19.

The pixel defining layer 24 is disposed above the second anode 23, and the second hole transport layer 25 is disposed above the second anode 23 and the pixel defining layer 24.

The second luminescent layer 26, the second electron transport layer 27, the second cathode 28, the transition layer 29, the first cathode 30, the first electron transport layer 31, the first luminescent layer 32, the first hole transport layer 33, and the first anode 34 are sequentially arranged above the second hole transport layer 25.

Figure 6:
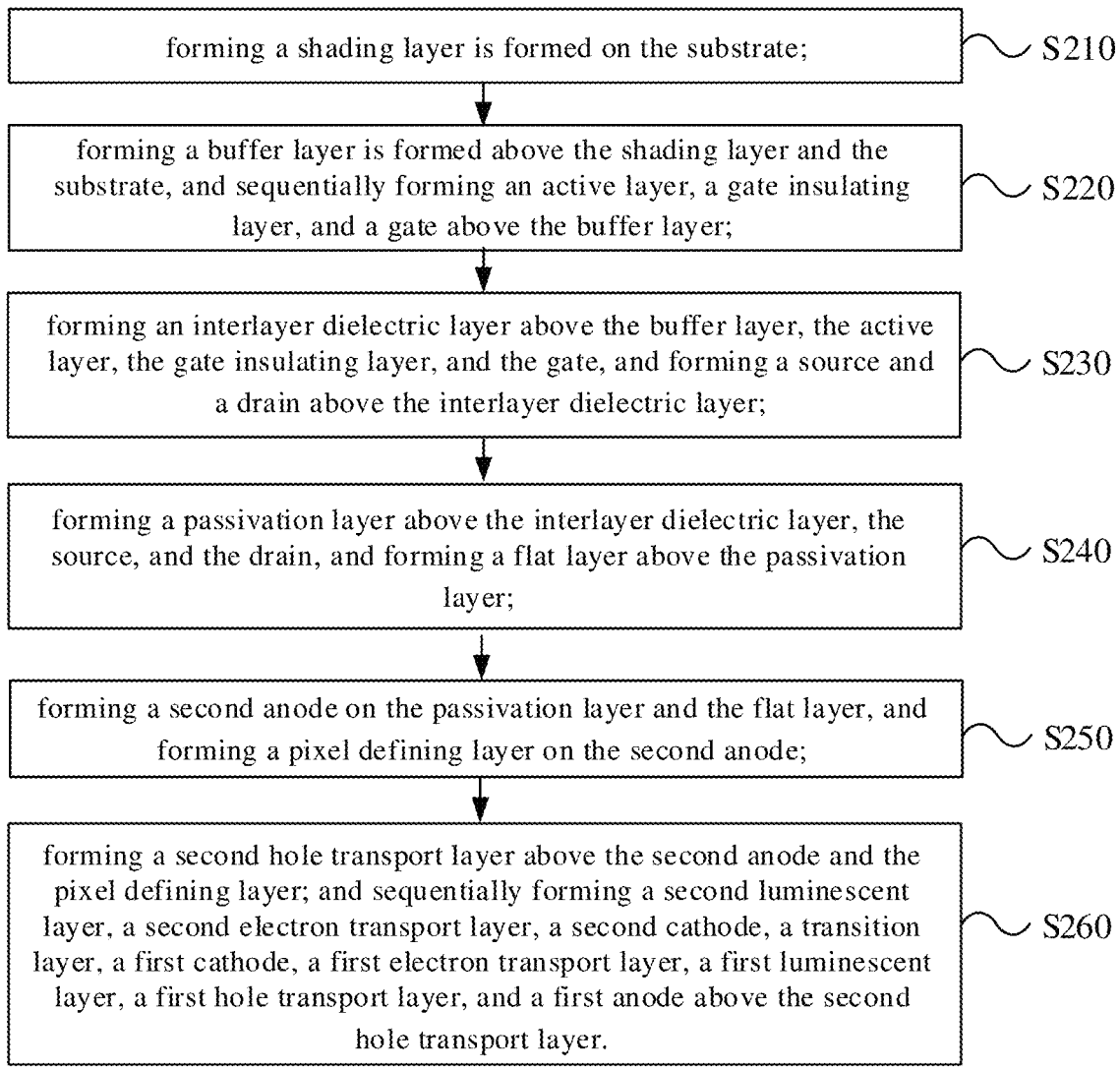
FIG. 6 is a schematic flowchart of a method for fabricating a display panel provided by an embodiment of the present application.

FIG. 6 is a schematic flow chart of a method for fabricating a display panel provided by an embodiment of the present application. As shown in FIG. 6, the method for fabricating a display panel provided by the embodiment of the present application may include steps S210-S260:

In step S210, a shading layer is formed on the substrate.

Specifically, the shading layer 12 can be formed above the substrate 11 by using a plasma enhanced chemical vapor deposition process. During formation of the shading layer 12, the shading layer 12 can be patterned. Specifically, the shading layer 12 can be patterned by coating a photoresist, exposing, developing, wet etching, removing the photoresist, and other process.

The shading layer 12 may be made of a metal, such as molybdenum, titanium, copper, and an oxide thereof, or made of a black resin and the like.

In step S220, a buffer layer is formed above the shading layer and the substrate, and an active layer, a gate insulating layer, and a gate are sequentially formed above the buffer layer.

Specifically, the buffer layer 13 can be formed on the shading layer 12 by using a plasma enhanced chemical vapor deposition process. The buffer layer 13 may be made of silicon dioxide or the like.

Next, the active layer 14, the gate insulating layer 15, and the gate 16 are sequentially formed on the buffer layer 13 by using a combination of the plasma enhanced chemical vapor deposition process and the patterning process.

In step S230, an interlayer dielectric layer is formed above the buffer layer, the active layer, the gate insulating layer, and the gate, and a source and a drain are formed above the interlayer dielectric layer.

Specifically, the interlayer dielectric layer 20 can be formed above the buffer layer 13, the active layer 14, the gate insulating layer 15, and the gate 16, and then a plurality of via holes 19 are formed in the interlayer dielectric layer 20, after that, the source 17 and the drain 18 are formed in the via holes 19 and above the interlayer dielectric layer 20. The source 17 and the drain 18 can contact the active layer 14 through different via holes 19.

In step S240, a passivation layer is formed above the interlayer dielectric layer, the source, and the drain, and a flat layer is formed above the passivation layer.

Specifically, a plasma enhanced chemical vapor deposition process may be used to form the passivation layer above the interlayer dielectric layer 20, the source 17, and the drain 18, and the flat layer 22 is formed on the passivation layer.

In step S250, a second anode is formed on the passivation layer and the flat layer, and a pixel defining layer is formed on the second anode.

Specifically, the via holes 19 can be formed in the passivation layer 21 and the flat layer 22 by coating a photoresist, exposing, developing, dry etching, removing the photoresist and other processes, and then the second anode 23 is formed in the via holes 19 and on the flat layer 22, after that, the pixel defining layer 24 is formed on the second anode by exposing, curing, etching, and other processes.

In step S260, a second hole transport layer is formed above the second anode and the pixel defining layer; and a second luminescent layer, a second electron transport layer, a second cathode, a transition layer, a first cathode, a first electron transport layer, a first luminescent layer, a first hole transport layer, and a first anode are sequentially formed above the second hole transport layer.

Specifically, the second hole transport layer 25 can be formed on the second anode 23 and the pixel defining layer 24 through evaporation process. Next, the second luminescent layer 26, the second electron transport layer 27, the second cathode 28, the transition layer 29, the first cathode 30, the first electron transport layer 31, the first luminescent layer 32, the first hole transport layer 33, and the first anode 34 are sequentially formed on the second hole transport layer 25 through evaporation process.

The first hole transport layer 33 and the second hole transport layer 25 can be made of a hole transport material, which can be a triarylamine series compound, a biphenyl diamine derivative, a cross-linked diamine biphenyl, and the like.

The first electron transport layer 31 and the second electron transport layer 27 are made of an electron transport material, which can be a metal chelate, an azole compound, a phenanthroline derivative, and the like.

In the technical solution provided by embodiments of the present application, the light emitting device comprises: the first light emitting unit, and the second light emitting unit arranged beneath the first light emitting unit. The first light emitting unit and the second light emitting unit are alternately conducted. The first light emitting unit comprises: the first cathode, the first electron transport layer, the first luminescent layer, the first hole transport layer, and the first anode arranged sequentially from bottom to top. The second light emitting unit comprises: the second anode, the second hole transport layer, the second luminescent layer, the second electron transport layer, and the second cathode arranged sequentially from bottom to top. The first cathode, the first anode, the second cathode, and the second anode are all connected to AC power supplies, respectively. In the above technical solution, the first light emitting unit and the second light emitting unit are conducted alternately, so that the service life of the first light emitting unit and the service life of the second light emitting unit can be doubled, that is, this technical solution can make the service life of the light emitting device doubled. In addition, the first cathode, the first anode, the second cathode, and the second anode are all connected to the AC power supply, so that the influence of the DC voltage on the threshold voltage of the driving thin film transistor of the light emitting device can be reduced, and the display difference in alternate light emitting of the OLEDs is reduced, thereby improving the display effect.

In the above-mentioned embodiments, the descriptions of the embodiments have their own emphases, and for parts that are not detailed or recorded in a certain embodiment, relevant descriptions of other embodiments can be referred to.

In addition, the size ratio relationship among the various components in the drawings is only schematic, which does not reflect the actual size ratio relationship between the various components.

In the description of the present application, orientations or positional relationships indicated by the terms "central", "longitudinal", "transverse", "upper", "lower", "front", "rear", "left", "right", "vertical" "horizontal", "top", "bottom", "inner", "outer", and the like are based on the orientations or positional relationships shown in the drawings, and are only for the convenience of describing the present application and simplifying the description, rather than indicating or implying that a referenced device or element must have a particular orientation, or be constructed and operated in a particular orientation, and should therefore not be construed as limiting the present application.

In the description of the present application, it should be noted that unless otherwise specified and limited, the terms "installation" and "connection" should be understood in a broad sense, for example, it can be a fixed connection or a detachable connection, or an integral connection; it can be mechanically connected or electrically connected; it can be directly connected or indirectly connected through an intermediary, and it can be the internal communication of two components. Those skills in the art can understand the specific meanings of the above terms in the present application based on specific situations.

It should be understood that when used in this specification and the appended claims, the term "comprising" indicates the presence of described features, integers, steps, operations, elements, and/or components, but does not exclude existence or addition of one or more other features, wholes, steps, operations, elements, components and/or collections thereof.

In the description of the present application, unless otherwise specified, "/" means that the objects associated with each other are an "or" relationship, for example, A/B can mean A or B; "and/or" in the present application is only an association relationship describing associated objects, which means that there can be three kinds of relationships, for example, A and/or B, which can mean: A exists alone, A and B exist at the same time, and B exists alone, in which, A and B can be singular or plural.

In the description of the present application, unless otherwise specified, "plurality" means two or more than two. "At least one of the following" or similar expressions refer to any combination of these items, including any combination of single items or plural items. For example, at least one of a, b, or c can represent: a, b, c, a-b, a-c, b-c, or a-b-c, in which, a, b, c can be singular or plural.

In addition, in the description of the specification and the appended claims of the present application, the terms "first", "second", "third", and the like are used to distinguish similar objects, and not necessarily used to describe a specific order or sequence order. It is to be understood that the terms so used are interchangeable under appropriate circumstances such that the embodiments described herein can be practiced in sequences other than those illustrated or described herein.

Reference to "an embodiment" or "some embodiments" or the like in the specification of the present application means that a particular feature, structure, or characteristic described in connection with such embodiment is included in one or more embodiments of the present application. Thus, appearances of the phrases "in an embodiment", "in some embodiments", "in other embodiments", "in still other embodiments", and the like in various places in this specification are not necessarily all refer to the same embodiment, but mean "one or more but not all embodiments", unless specifically stated otherwise.

Finally, it should be noted that: the above embodiments are only used to illustrate the technical solutions of the present application, rather than making limitations on the technical solutions; although the application has been described in detail with reference to the foregoing embodiments, those skills in the art should understand that: it is still possible to modify the technical solutions described in the foregoing embodiments, or perform equivalent replacements for some or all of the technical features; and these modifications or replacements do not make the essence of the corresponding technical solutions deviate from the scope of technical solutions of the various embodiments of the present application.

What is claimed is:

1. A light emitting device, comprising:
   a first light emitting unit comprising: a first cathode, a first electron transport layer, a first luminescent layer, a first hole transport layer, and a first anode arranged sequentially from bottom to top; and
   a second light emitting unit comprising: a second anode, a second hole transport layer, a second luminescent layer, a second electron transport layer, and a second cathode arranged sequentially from bottom to top; wherein
   the second light emitting unit is arranged beneath the first light emitting unit;
   the first light emitting unit and the second light emitting unit are alternately conducted; and
   the first cathode, the first anode, the second cathode, and the second anode are all connected to AC power supplies, respectively.

2. The light emitting device according to claim 1, wherein the first anode and the second cathode are connected to a same AC power supply.

3. The light emitting device according to claim 1, wherein the first anode, the first cathode, the second anode, and the second cathode are connected to different AC power supplies, respectively.

4. The light emitting device according to claim 1, further comprising a transition layer disposed between the first cathode and the second cathode.

5. The light emitting device according to claim 4, wherein the first cathode, the second cathode, and the transition layer are all made of transparent conductive materials.

6. The light emitting device according to claim 1, wherein in each alternate conduction cycle, a number of conduction frames of the first light emitting unit and a number of conduction frames of the second light emitting unit are both N frames, wherein, N is a positive integer.

7. The light emitting device according to claim 5, wherein in each alternate conduction cycle, a number of conduction frames of the first light emitting unit and a number of conduction frames of the second light emitting unit are both N frames, wherein, N is a positive integer.

8. A method for driving the light emitting device according to claim 1, the method comprising:
   in a first half cycle of each alternate conduction cycle, outputting higher potential voltages to the first cathode and the second cathode, respectively, and outputting lower potential voltages to the first cathode and the second anode, respectively; and
   in a second half cycle of each alternate conduction cycle, outputting lower potential voltages to the first cathode and the second cathode, respectively, and outputting higher potential voltages to the first cathode and the second anode, respectively.

9. The method according to claim 8, wherein the first anode and the second cathode are connected to a same AC power supply.

10. The method according to claim 8, wherein the first anode, the first cathode, the second anode, and the second cathode are connected to different AC power supplies, respectively.

11. The method according to claim 8, further comprising a transition layer disposed between the first cathode and the second cathode.

12. The method according to claim 11, wherein the first cathode, the second cathode, and the transition layer are all made of transparent conductive materials.

13. The method according to claim 8, wherein in each alternate conduction cycle, a number of conduction frames of the first light emitting unit and a number of conduction frames of the second light emitting unit are both N frames, wherein, N is a positive integer.

14. A display panel, comprising a plurality of pixels, each pixel comprising the light emitting device according to claim 1.

15. The display panel according to claim 14, further comprising: a substrate, a shading layer, a buffer layer, an active layer, a gate insulating layer, a gate, a source, a drain, a plurality of via holes, an interlayer dielectric layer, a passivation layer, a flat layer, and a pixel defining layer;
the shading layer is disposed above the substrate; the buffer layer is disposed above the shading layer and the substrate; the active layer is disposed above the buffer layer; the gate insulating layer is disposed above the active layer; the gate is disposed above the gate insulating layer;
the interlayer dielectric layer is disposed above the buffer layer, the active layer, the gate insulating layer, and the gate;
the source and the drain are disposed above the interlayer dielectric layer, and are in contact with two ends of the active layer through different via holes;
the passivation layer is disposed above the interlayer dielectric layer, the source, and the drain; the flat layer is disposed above the passivation layer;
the second anode is disposed above the flat layer and the passivation layer, and is in contact with the source or the drain through via holes; and
the pixel defining layer is disposed above the second anode; and the second hole transport layer is disposed above the second anode and the pixel defining layer.

16. The display panel according to claim 14, wherein the first anode and the second cathode are connected to a same AC power supply.

17. The display panel according to claim 14, wherein the first anode, the first cathode, the second anode, and the second cathode are connected to different AC power supplies, respectively.

18. The display panel according to claim 14, further comprising a transition layer disposed between the first cathode and the second cathode.

19. The display panel according to claim 18, wherein the first cathode, the second cathode, and the transition layer are all made of transparent conductive materials.

20. The display panel according to claim 14, wherein in each alternate conduction cycle, a number of conduction frames of the first light emitting unit and a number of conduction frames of the second light emitting unit are both N frames, wherein, N is a positive integer.

* * * * *